(12) United States Patent
Sirton et al.

(10) Patent No.: US 8,305,409 B2
(45) Date of Patent: Nov. 6, 2012

(54) FORMING AN IMAGE WITH A PLURALITY OF IMAGING HEADS

(75) Inventors: Guy Sirton, Delta (CA); Greg Peregrym, New Westminster (CA)

(73) Assignee: Kodak Graphic Communications Canada Company, Burnaby (CA)

( * ) Notice: Subject to any disclaimer, the term of this patent is extended or adjusted under 35 U.S.C. 154(b) by 438 days.

(21) Appl. No.: 12/305,797

(22) PCT Filed: Jun. 18, 2007

(86) PCT No.: PCT/IB2007/001628
§ 371 (c)(1),
(2), (4) Date: Mar. 31, 2010

(87) PCT Pub. No.: WO2008/004046
PCT Pub. Date: Jan. 10, 2008

(65) Prior Publication Data
US 2010/0188472 A1    Jul. 29, 2010

Related U.S. Application Data

(60) Provisional application No. 60/806,452, filed on Jun. 30, 2006.

(51) Int. Cl.
*B41J 2/32* (2006.01)
*B41J 2/47* (2006.01)
(52) U.S. Cl. .................. 347/171; 347/225; 347/251
(58) Field of Classification Search .......... 347/224, 347/225, 233, 171, 251
See application file for complete search history.

(56) References Cited

U.S. PATENT DOCUMENTS

| 5,220,348 | A | 6/1993 | D'Aurelio |
| 5,517,359 | A | 5/1996 | Gelbart |
| 5,691,759 | A | 11/1997 | Hanson |
| 5,808,655 | A | 9/1998 | Haas et al. |
| 6,480,324 | B2 | 11/2002 | Quate et al. |
| 6,582,875 | B1 | 6/2003 | Kay et al. |
| 6,597,388 | B2 | 7/2003 | Pierson |
| 6,957,773 | B2 | 10/2005 | Gelbart |
| 8,199,175 | B2 * | 6/2012 | Sirton ................. 347/171 |
| 2003/0169502 | A1 | 9/2003 | Ogura |
| 2009/0309954 | A1 * | 12/2009 | Sirton et al. .......... 347/248 |
| 2010/0039490 | A1 * | 2/2010 | Sirton ................. 347/251 |

FOREIGN PATENT DOCUMENTS

| CA | 2364858 | 8/2002 |
| EP | 0 947 950 | 10/1999 |

* cited by examiner

*Primary Examiner* — Huan Tran
(74) *Attorney, Agent, or Firm* — Nelson Adrian Blish

(57) ABSTRACT

A method is provided which includes operating a first multi-channel imaging head to direct imaging beams along a scan path to transfer a first non-contiguous feature and a second non-contiguous feature from a donor element to the receiver element by a thermal transfer process. The first and second non-contiguous features are spatially separated from one another at least in a sub-scan direction. The method also includes operating a second multi-channel imaging head to direct imaging beams to direct imaging beams to transfer a third non-contiguous feature from the donor element to the receiver element by the thermal transfer process. The third non-contiguous feature is between the first and second non-contiguous features and is spatially separated from each of the first and second non-contiguous features at least in the sub-scan direction.

1 Claim, 11 Drawing Sheets ically available. For example, a SQUAREspot® model thermal imaging head manufactured by Kodak Graphic Communications Canada Company, British Columbia, Canada has several hundred independent channels. Each channel can have power in excess of 25 mW. The array of imaging chan-
FORMING AN IMAGE WITH A PLURALITY OF IMAGING HEADS

RELATED APPLICATIONS

This application claims priority to U.S. Provisional Application No. 60/806,452 entitled "METHODS AND APPARATUS FOR APPLYING PATTERNS OF NON-CONTIGUOUS FEATURES" filed Jun. 30, 2006.

TECHNICAL FIELD

The invention relates to imaging systems and to methods for forming an image with a plurality of imaging heads. The image can include a pattern of features. The invention may be applied to fabricating color filters for electronic displays, for example.

BACKGROUND

Color filters used in display panels typically include a matrix comprising a plurality of color features. The color features may include patterns of red, green and/or blue color features, for example. Color filters may be made with color features of other colors. The color features may be arranged in any of various suitable configurations. Prior art stripe configurations have alternating columns of red, green and blue color features as shown in FIG. 1A.

FIG. 1A shows a portion of a prior art "stripe configuration" color filter 10 having a plurality of red, green and blue color elements 12, 14 and 16 respectively formed in alternating columns across a media or receiver element 18. Color elements 12, 14 and 16 are outlined by portions of a matrix 20. The columns can be imaged in elongate stripes that are subdivided by matrix cells 34 (herein referred to as cells 34) into individual color elements 12, 14 and 16. TFT transistors on the associated LCD panel (not shown) may be masked by areas 22 of matrix 20.

Laser-induced thermal transfer processes have been proposed for use in the fabrication of displays, and in particular color filters. When laser-induced thermal transfer processes are used to produce a color filter, a color filter substrate also known as a receiver element is overlaid with a donor element that is then image-wise exposed to selectively transfer a colorant from the donor element to the receiver element. Preferred exposure methods use radiation beams such as laser beams to induce the transfer of the colorant to the receiver element. Diode lasers are particularly preferred for their ease of modulation, low cost and small size.

Laser induced "thermal transfer" processes include: laser induced "dye transfer" processes, laser-induced "melt transfer" processes, laser-induced "ablation transfer" processes, and laser-induced "mass transfer" processes. Colorants transferred during laser-induced thermal transfer processes include suitable dye-based or pigment-based compositions. Additional elements such as one or more binders may be transferred, as is known in the art.

Some conventional laser imaging systems have employed a limited number of imaging beams. Other conventional systems have employed hundreds of individually-modulated beams in parallel to reduce the time taken to complete images. Imaging heads with large numbers of such "channels" are readily available. For example, a SQUAREspot® model thermal imaging head manufactured by Kodak Graphic Communications Canada Company, British Columbia, Canada has several hundred independent channels. Each channel can have power in excess of 25 mW. The array of imaging channels can be controlled to write an image in a series of image swaths which are closely aligned to form a continuous image.

One problem with multi-channel imaging systems is that it is very difficult to ensure that all channels have identical imaging characteristics. Variations in the output radiation conditions incident upon the imaged media can cause imaging artifacts such as banding and edge discontinuities. Variations in the output radiation emitted by the array of imaging channels may originate from channel-to-channel variations in power, beam size, beam shape, focus and coherence. Banding artifacts may not be solely attributable to the imaging system. The imaged media itself may also contribute to banding, and other imaging artifacts. Banding can take the form of visual differences between adjacent image swaths.

Image artifacts can also be complicated when imaging pattern of features as typically required in the production of color filters. Color filters typically consist of a repeating pattern of color features, each of the features corresponding to one of the colors required by the color filter. Since the features form a repeating pattern, a visual beating readily perceptible by the human eye can result thereby accentuating any banding that has arisen as a result of the imaging process. A reduction in the quality of the color filter can result.

To increase imaging productivity, imaging systems including a plurality of imaging heads have been proposed. By employing a plurality of imaging heads, various portions of an image can be imaged by corresponding imaging heads, advantageously reducing the time required to form the completed image. Various problems however are associated with multi-imaging head systems. For example, the separate image portions need to be formed with an accuracy that allows them to be combined into a unified image thus requiring a high degree of registration between the various imaging heads. Various image artifacts can also be attributed to multi-imaging head systems, especially when each of the imaging heads includes a plurality of individually controllable channels. Since the channels in each of the imaging heads can have different imaging characteristics, visual discrepancies can arise between the various image portions formed by each imaging head. Visual discrepancies between the various image portions can aggravate the visual quality of the overall image.

There remains a need for effective and practical imaging methods and systems that can allow for the productivity benefits of multi-imaging head systems while reducing various image artifacts.

There remains a need for effective and practical imaging methods and systems that permit the making of patterns of non-contiguous features, such as the patterns of color features in a color filter with multi-head imaging systems.

SUMMARY OF THE INVENTION

The present invention provides a method for forming a plurality of non-contiguous features on a receiver element. The features may be formed by a thermal transfer process such as a laser-induced dye-transfer process, or a laser-induced mass transfer process. The process can be carried out by transferring a colorant from a donor element to a receiver element and can include transferring a colorant and a binder from the donor element to the receiver element. In one example embodiment, each of the non-contiguous features can be screened with a halftone screen or a stochastic screen.

The features can form a pattern or repeating pattern in the cells of a matrix. The features may form a mosaic pattern or may be island features in which features of one color are separated from each other by features of another color in one or more directions. The features may be formed on a color filter, or may be illumination sources on, for example, an organic light emitting diode ("OLED") display.

In one embodiment, the method includes operating a first multi-channel imaging head to direct imaging beams along a scan path to transfer a first non-contiguous feature and a second non-contiguous feature from a donor element to a receiver element. The first and second non-contiguous features are spatially separated from one another at least in a sub-scan direction. A second multi-channel imaging head is operated to direct imaging beams to transfer a third non-contiguous feature from the donor element to the receiver element. The third non-contiguous feature is placed between the first and second non-contiguous features and is spatially separated from each of the first and second non-contiguous features at least in the sub-scan direction. The first, second and third non-contiguous features can be part of a pattern of non-contiguous features. Two or more sets of the non-contiguous features can be transferred from the pattern of non-contiguous features. Each set can include one or more of the non-contiguous features. Some non-contiguous features in a first set of the two or more sets can be interleaved with the non-contiguous features in an additional set of the two or more sets. The non-contiguous features can be assigned to at least one of the two or more sets randomly or according to a predetermined arrangement.

In one example embodiment, the first multi-channel imaging head transfers a first set of the two or more sets while the second multi-channel imaging head transfers an additional set of the two or more sets. The first set can include a plurality of groups of one or more non-contiguous features and each group is separated from each other group by varying numbers of non-contiguous features of the additional set. A minimum spacing between each group can be greater than a minimum spacing between features in the pattern. Each group can be separated from each other group by varying distances. In another example embodiment, the first set includes a first plurality of groups of one or more non-contiguous features arranged along a first direction and the spacing between adjacent groups of the first plurality of groups increases in the first direction. The additional set includes a second plurality of groups of one or more non-contiguous features arranged along the first direction and the spacing between adjacent groups of the second plurality decreases in the first direction. The first direction can be the sub-scan direction The features can be interleaved in the direction of the scan path as well. First and second multi-channel imaging heads can transfer non-contiguous features from the donor element to the receiver element by placing non-contiguous features between other non-contiguous features in the direction of the scan path. The donor element can be separated from the receiver element after transferring the first, second and third non-contiguous features from the donor element to the receiver element.

Each of the first and second non-contiguous features can be transferred to the receiver element by operating a plurality of contiguous channels of the first multi-channel imaging head. The third non-contiguous feature can be transferred by operating a plurality of contiguous channels of the second multi-channel imaging head.

The first, second and third non-contiguous features can be features of a pattern of non-contiguous features and the pattern can be a repeating pattern of features. In one example embodiment, the non-contiguous features in the pattern are spatially separated from one another at least in the direction transverse to the scan path.

In one embodiment, some of the non-contiguous features form part of a stripe that can be continuous in a direction of the scan path or can be interrupted in a direction of the scan path. The stripe can include chevron-shaped portions and can bend back and forth as it continues along the direction of the scan path.

In one example embodiment, the first multi-channel imaging head is operated to direct imaging beams to transfer a first plurality of non-contiguous features from the donor element to the receiver element; and the second multi-channel imaging head is operated to direct imaging beams to transfer a second plurality of non-contiguous features from the donor element to the receiver element. In this example embodiment, each feature of the second plurality of non-contiguous features is not between any of the features of the first plurality of non-contiguous features. The transfer of the first plurality of non-contiguous features to the receiver element can be made by a plurality of scans.

In one example embodiment, the method includes dividing the first plurality of non-contiguous features into a first plurality of interleaved sets and transferring each set of the first plurality of interleaved sets to the receiver element in a corresponding separate one of a plurality of scans of the first multi-channel imaging head. In addition, the method can include dividing the second plurality of non-contiguous features into a second plurality of interleaved sets and transferring each set of the second plurality of interleaved sets to the receiver element in a corresponding separate one of a plurality of scans of the second multi-channel imaging head.

A computer program product can be used to cause a controller to operate a first multi-channel imaging head to direct imaging beams along a scan path to transfer a first non-contiguous feature and a second non-contiguous feature from the donor element to the receiver element by a thermal transfer process. The first and second non-contiguous features can be spatially separated from one another at least in a sub-scan direction. The controller can operate a second multi-channel imaging head to direct imaging beams to direct imaging beams to transfer a third non-contiguous feature from the donor element to the receiver element by the thermal transfer process. The third non-contiguous feature can be placed between the first and second non-contiguous features and can be spatially separated from each of the first and second non-contiguous features at least in the sub-scan direction.

BRIEF DESCRIPTION OF THE DRAWINGS

Embodiments and applications of the invention are illustrated by the attached non-limiting drawings. The attached drawings are for purposes of illustrating the concepts of the invention and may not be to scale.

DETAILED DESCRIPTION

Throughout the following description specific details are presented to provide a more thorough understanding to persons skilled in the art. However, well-known elements may not have been shown or described in detail to avoid unnecessarily obscuring the disclosure. Accordingly, the description and drawings are to be regarded in an illustrative, rather than a restrictive, sense.

This invention relates to imaging patterns of non-contiguous features. The patterns may include repeating patterns or non-repeating patterns. The patterns are not necessarily regular patterns A non-contiguous feature is a feature that is separated from other features at least in a sub-scan direction. In some embodiments the non-contiguous features are macroscopic graphic entities (i.e. entities that are large enough to be resolved by the unaided human eye). In some such embodiments the non-contiguous features have dimensions in a sub-scan direction that can be at least $\frac{1}{20}$ mm.

Figure 1A:
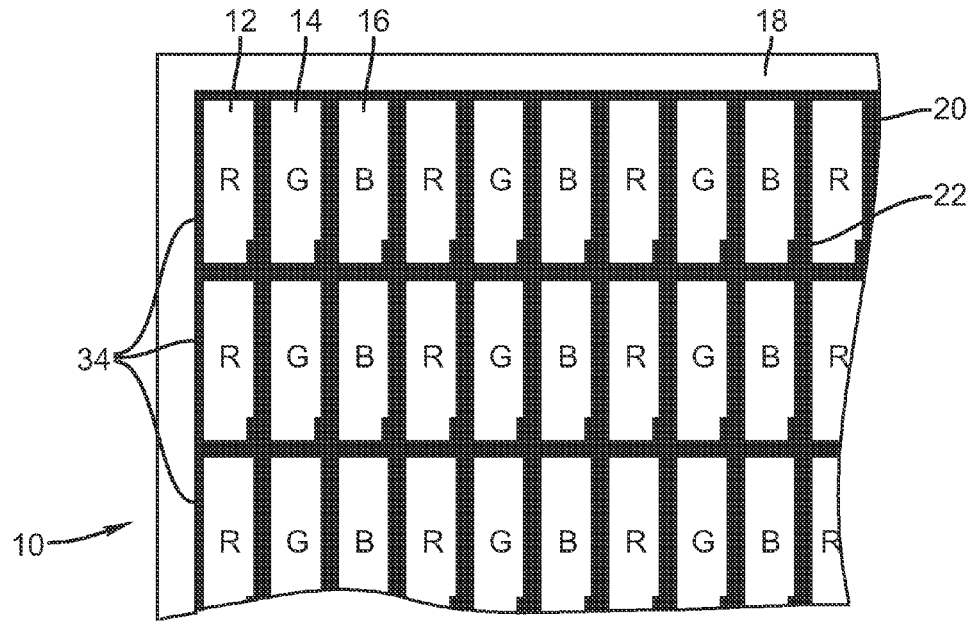
FIG. 1A is a plan view of a portion of a color filter.
Figure 1B:
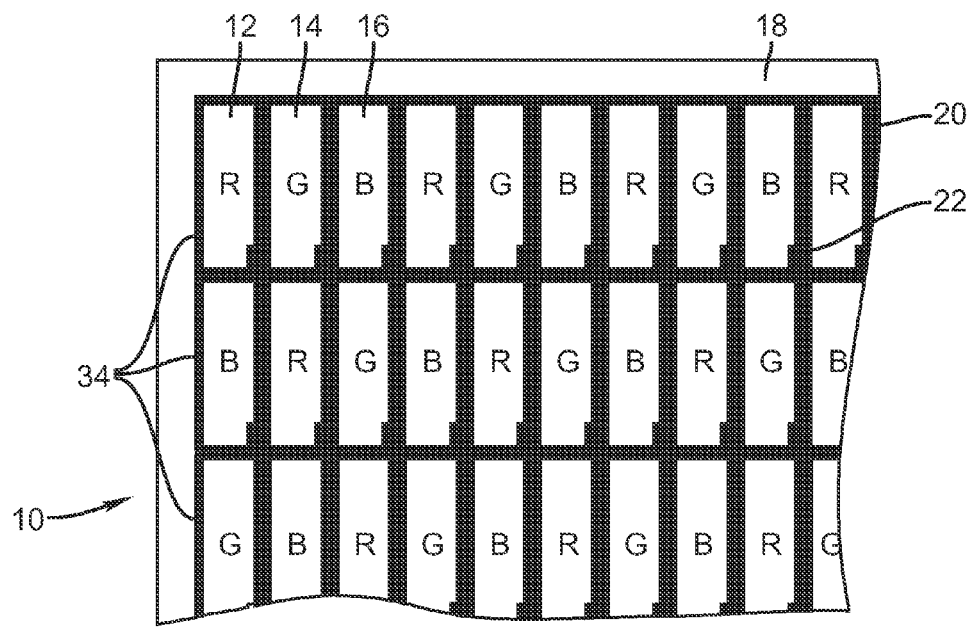
FIG. 1B is a plan view of a portion of another color filter.

Color elements of one color from color filters of a type used in LCD display panels are an example of non-contiguous features. Color filters used in LCD display panels typically comprise patterns of color elements of each of a plurality of colors. The color elements may include red, green and/or blue color elements, for example. The color elements may be arranged in any of various suitable configurations. For example:

Stripe configurations, shown in FIG. 1A, have alternating columns of red, green and blue;

Mosaic configurations shown in FIG. 1B, have color elements alternating in both dimensions of the mosaic;

Delta configurations (not shown) having red, green and blue filter elements in a triangular relationship to each other are also used.

Whereas the illustrated examples described above show patterns of rectangular shaped color filter elements, other patterns including other shaped elements are also known in the art.

Figure 1C:
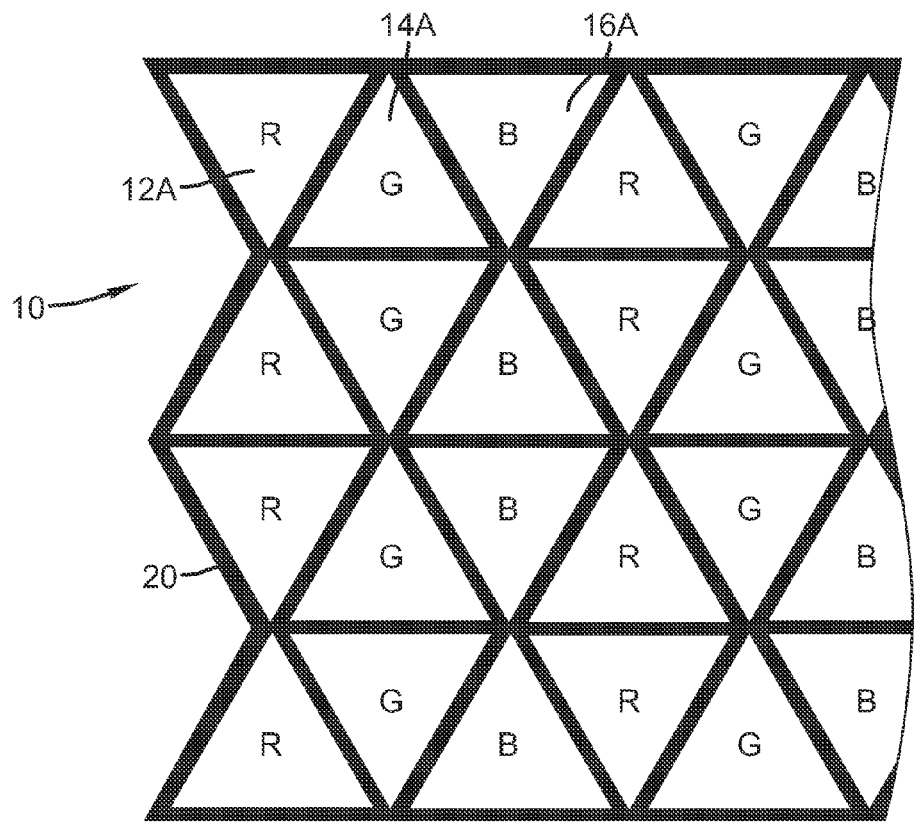
FIG. 1C is a plan view of a portion of another color filter.

FIG. 1C shows a portion of a prior art color filter 10 with a configuration of triangular shaped color elements 12A, 14A and 16A. As illustrated in FIG. 1C, each of the respective color elements are arranged along columns and are separated by matrix 20.

Figure 1D:
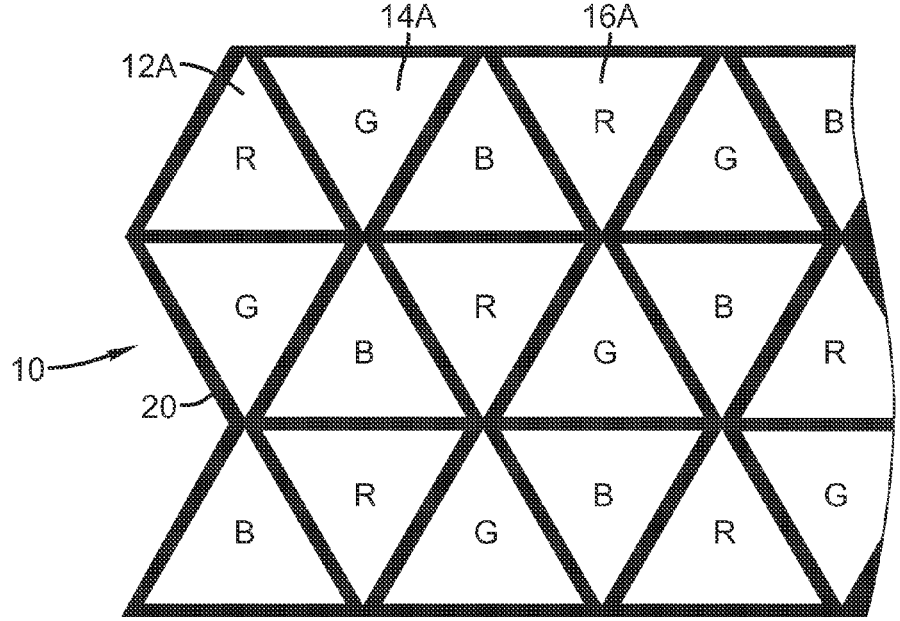
FIG. 1D is a plan view of a portion of another color filter.

FIG. 1D shows a portion of a prior art color filter 10 with a configuration of triangular shaped color elements 12A, 14A and 16A. As illustrated in FIG. 1D, each of the respective color elements alternate along the columns and rows of color filter 10. As shown in FIGS. 1C and 1D, color elements 12A, 14A and 16A can have different orientations within a given row or column.

Figure 1E:
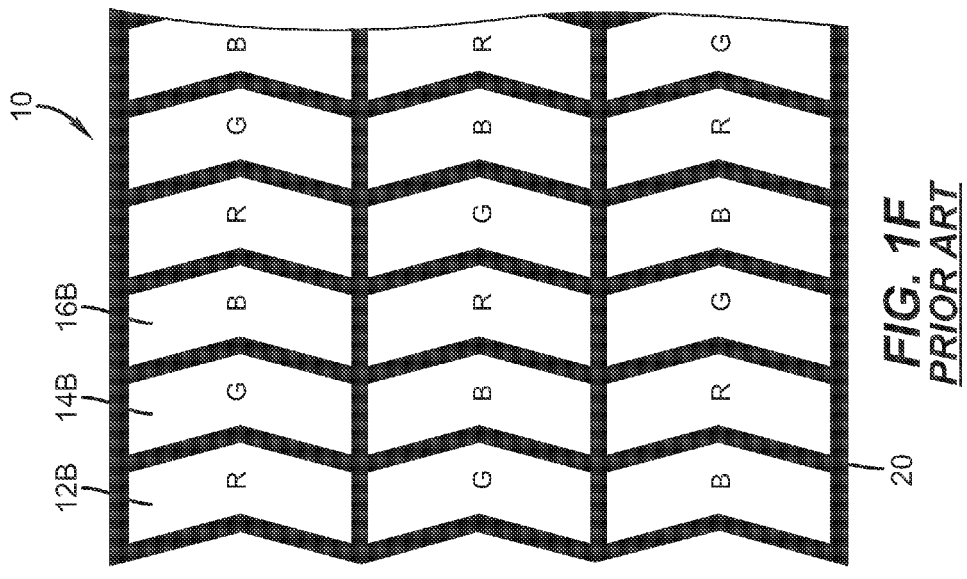
FIG. 1E is a plan view of a portion of another color filter.

FIG. 1E shows a portion of a prior art color filter 10 that includes a configuration of chevron shaped color features 12B, 14B and 16B. As illustrated in FIG. 1E, each of the respective color elements are arranged along columns and are separated by matrix 20. Color elements 12B, 14B and 16B are formed from "zig-zag" shaped color stripes that bend from side to side in a direction of the stripe.

Figure 1F:
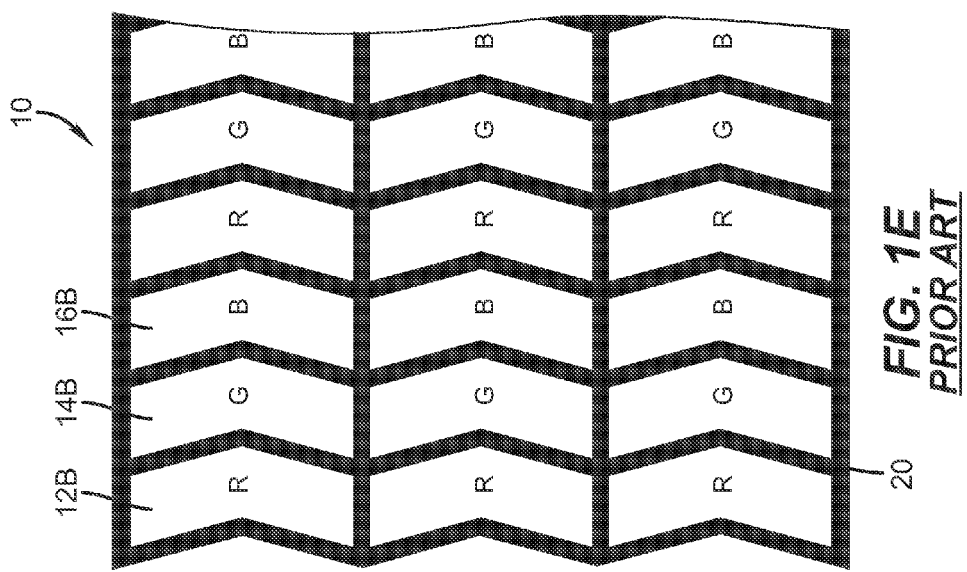
FIG. 1F is a plan view of a portion of another color filter.

FIG. 1F shows a portion of a prior art color filter 10 that includes a configuration of chevron shaped color elements 12B, 14B and 16B. As illustrated in FIG. 1F, each of the respective color elements alternate in along the columns and rows of color filter 10.

The shape and configuration of a color filter element can be selected to provide desired color filter attributes such as a better color mix or enhanced viewing angles.

Referring to FIG. 1A, color elements 12, 14 and 16 are outlined by portions of a color filter matrix 20 (also known as matrix 20), which divide the elements. Matrix 20 can help to prevent any backlight leaking between the elements. The columns of elements are commonly imaged in elongated stripes and then sub-divided by matrix 20 into individual color elements 12, 14, and 16. TFT transistors on the associated LCD panel (not shown) are typically masked by portions 22 of the matrix.

FIG. 1B shows a portion of a conventional color filter 10 arranged in a mosaic configuration in which color elements 12, 14 and 16 alternate down the columns as well as across the columns. The color elements in mosaic and delta configurations are example of "island" features since each element of a given color is spatially separated from other features of the same color in several directions.

It is to be noted that the color filters are not limited to the red, green and blue color sequences shown in FIG. 1 and other color sequences may also be employed.

Color elements may be applied by "thermal transfer" processes. Thermal transfer processes include laser-induced thermal transfer processes. Thermal transfer processes can include the image-wise transfer of dyes and other image-forming materials, such as pigments and similar colorant compositions. Thermal transfer processes can include the transfer of a colorant and a binder.

Typically, during the manufacture of a color filter 10, each of the color elements 12, 14 and 16 can either partially or completely overlap the respective portions of the matrix 20 that outline each respective color element. Overlapping the black matrix can reduce the registration issues that would be encountered if one were to try to apply color to a given color element exactly within the boundaries of that element which is delineated by corresponding portions of the matrix 20.

Where a thermal transfer process is used to produce color elements, edge discontinuities and various artifacts such as pinholes may occur when each successive color donor element is removed post-imaging. These artifacts may occur because the colored image forming material that has been transferred at the edges may not have sufficient adhesive peel strength to remain attached to the receiver element when the color donor is peeled off. Overlapping the matrix 20 can hide any such edge discontinuities and may help to ensure that the desired contrast between the respective color elements is achieved since "colorless" voids within the color elements themselves would be reduced.

Figure 3:
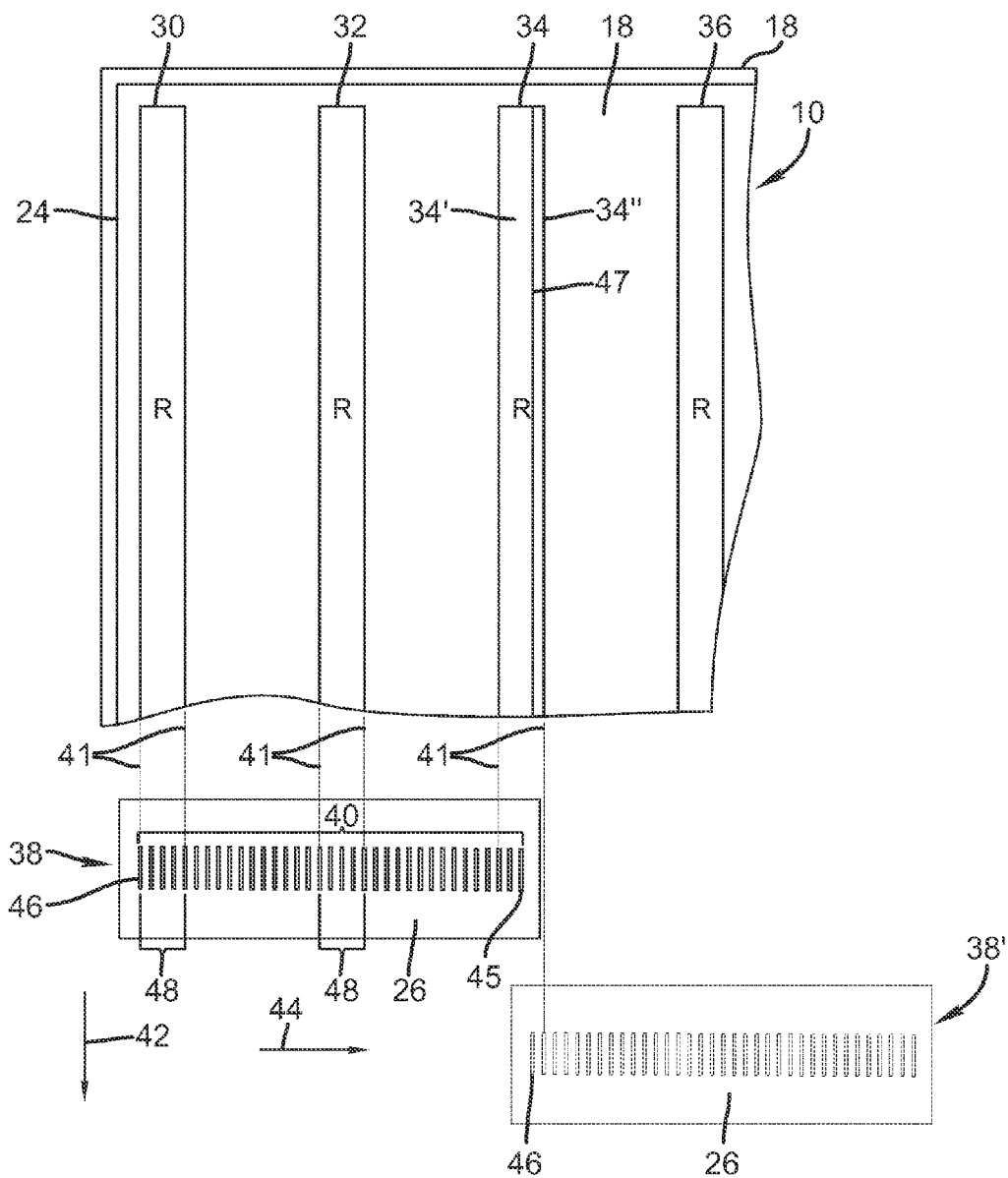
FIG. 3 is a schematic representation of prior art imaging of a receiver element.

FIG. 3 schematically shows a conventional laser-induced thermal transfer process being used to fabricate a color filter 10. This process involves directly imaging a medium with an imaging head 26. In this case the medium includes a color donor element 24 appropriately arranged with receiver element 18. Imaging head 26 includes an array of imaging channels and is used to transfer image-forming material from a donor element 24 to an underlying receiver element 18.

Receiver element 18 typically has a matrix 20 (not shown) formed on it. Although a laser-induced thermal transfer process could be used to form matrix 20 on receiver element 18, matrix 20 is typically formed by lithographic techniques.

Donor element 24 includes an image-forming material (not shown) that can be image-wise transferred onto the receiver element 18 when radiation emitted by imaging head 26 is scanned across donor element 24. Red, green and blue portions of filter 10 are typically imaged in separate imaging steps; each imaging step using a different color donor element appropriate for the color to be imaged. The red, green and blue portions of the filter are typically transferred to receiver element 18 in separate imaging steps. Each donor element 24 is removed upon completion of the corresponding imaging step. After the color elements have been transferred, the imaged color filter may be subjected to one or more additional processing steps, such as an annealing step for example, to change one or more physical properties (e.g. hardness) of the imaged color elements.

Figure 2:
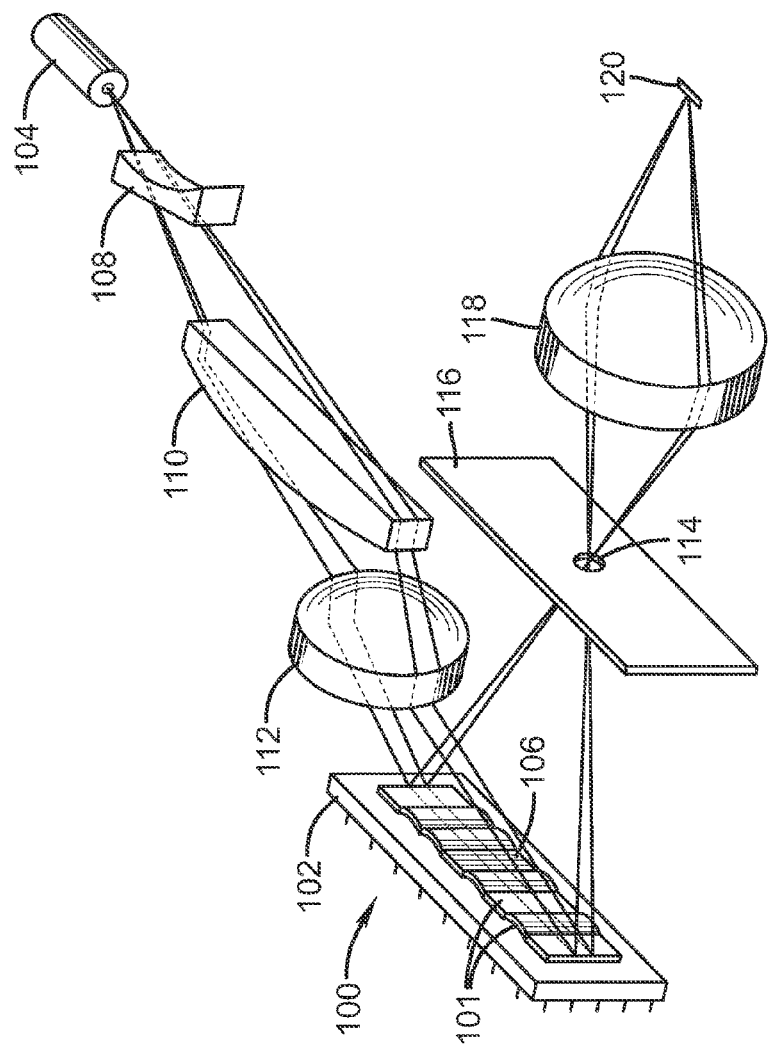
FIG. 2 is a partially schematic perspective view of the optical system of an example prior art multi-channel imaging head.

A conventional laser-based multi-channel imaging head that employs a spatial light modulator or light valve to create a plurality of imaging channels is shown schematically in FIG. 2. A linear light valve array 100 includes a plurality of deformable mirror elements 101 fabricated on a semi-conductor substrate 102. Mirror elements 101 are individually addressable. Mirror elements 101 can be micro-electro-mechanical (MEMS) elements, such as deformable mirror micro-elements, for example. A laser 104 can generate an illumination line 106 on light valve 100 using an anamorphic beam expander comprising cylindrical lenses 108 and 110. Illumination line 106 is laterally spread across the plurality of elements 101 so that each of the mirror elements 101 is illuminated by a portion of illumination line 106. U.S. Pat. No. 5,517,359 to Gelbart describes a method for forming an illumination line.

A lens 112 typically focuses laser illumination through an aperture 114 in an aperture stop 116 when elements 101 are in their un-actuated state. Light from actuated elements is blocked by aperture stop 116. A lens 118 images light valve 100 to form a plurality of individual image-wise modulated beams 120 which can be scanned over the area of a media to form an image swath. Each of the beams is controlled by one of the elements 101. Each of elements 101 controls a channel of a multi-channel imaging head.

Each of the beams is operable for imaging, or not imaging, an "image pixel" on the imaged substrate in accordance with the driven state of the corresponding element 101. That is, when required to image a pixel in accordance with the image data, a given element 101 is driven to produce a corresponding beam with an active intensity level suitable for imparting a pixel image on a media. When required not to image a pixel in accordance with the image data, a given element 101 is driven to not produce an imaging beam.

The receiver element 18, imaging head 26, or a combination of both, are displaced relative to one another while the channels of the imaging head 26 are controlled in response to image data to create image swaths. In some embodiments, the imaging head is stationary and receiver element moves; in other embodiments the receiver element is stationary and the imaging head moves; and in still other embodiments, both of the imaging head 26 and the receiver element 18 are moved to produce the desired relative motion between imaging head and the receiver element along one or more paths.

Any suitable mechanism may be applied to move imaging head 26 relative to a receiver element 18. When imaging relatively rigid receiver elements 18, as is common in fabricating display panels, the imager used is usually a flatbed imager that includes a support that secures receiver element 18 in a flat orientation. U.S. Pat. No. 6,957,773 to Gelbart discloses an example of a high-speed flatbed imager suitable for display panel imaging. Flexible receiver elements 18 may be secured to either an external or internal surface of a "drum-type" support to affect the imaging of the swaths.

FIG. 3 shows a portion of a color filter receiver element 18 that has been conventionally patterned with a plurality of red stripes 30, 32, 34 and 36 in a laser-induced thermal transfer process. In this process, a donor element 24 which includes an image forming material (again, not shown) is appropriately positioned on receiver element 18 and the plurality of red stripes 30, 32, 34 and 36 are imaged on receiver element 18 by transferring portions of the image-forming material onto receiver element 18. In FIG. 3, donor element 24 is shown as being smaller than receiver element 18 for the purposes of clarity only, and can overlap one or more portions of receiver element 18 as may be required.

Each of the red stripes 30, 32, 34 and 36 need not be only as wide as the final visible width of the color elements but may be of sufficient width to partially overlap matrix vertical segments (not shown) that delineate each red element within each respective stripe. Each successive imaging of a color donor element requires imaging a repeating pattern of non-contiguous features. Stripes 30, 32, 34 and 36 are an example of such a pattern of such non-contiguous features. Each of the stripes 30, 32, 34 and 36 are spatially separated from one another along sub-scan direction 44. Imaging head 26 includes a plurality of individually-addressable imaging channels 40, and is located in a first position 38. FIG. 3 depicts the correspondence between imaging channels 40 and the transferred pattern as broken lines 41.

While imaging head 26 is shown in FIG. 3 at the same scale as the imaged pattern, these schematic illustrations are only intended to show the correspondence between the imaging channels 40 and their respectively imaged elements and not necessarily a physical relationship. In practice, as shown in FIG. 2, the imaging beams are directed onto the substrate to be imaged by one or more lenses 118, which may reformat the size and shape of the imaging swath at the plane of the substrate.

The imaging beams generated by imaging head 26 are scanned over receiver element 18 along a scan path while being image-wise modulated according to the pattern of non-contiguous features to be formed. As represented in FIG. 3, the imaging beams are scanned along a scan path aligned with main-scan axis 42. Sub-groups of channels like channel sub-group 48 are driven appropriately to produce active imaging beams whenever it is desired to form a non-contiguous stripe feature. Other channels not corresponding to the features will be driven appropriately to not image corresponding areas. If all of the imageable channels of the imaging head 26 are driven to image corresponding pixels, imaging head 26 can produce an imaged swath whose width would be related to the distance between the first pixel imaged by a first activated channel in the array and the last pixel imaged as imaged by a last activated channel in the array. Since the receiver element 18 is typically too large to be imaged within a single image swath, multiple scans of imaging head are typically required to complete the imaging. In this case, each image swath is followed by a translation of the imaging head in a direction of sub-scan axis 44 so that a subsequent imaged swath will generally be lined up alongside the previous imaged swath.

As represented in FIG. 3, movement of imaging head 26 along direction of sub-scan axis 44 occurs after the imaging of each swath along a scan direction. Imaging head 26 can be translated relative to receiver element 18 along sub-scan axis 44 in synchrony with the main-scan motion in order to compensate for potential skew between the main-scan direction effected by the imaging system, and the desired placement of the image with respect to receiver element 18. With drum-type imagers, it may be possible to simultaneously move imaging head 26 both along main-scan axis 42 and sub-scan axis 44, thus writing the image in a plurality of swaths extending helically on the drum.

There are typically several options for aligning a previously imaged swath to a subsequently imaged swath. These options can include overlapping the previously- and subsequently-imaged swaths by one or more imaged pixel widths. Alternatively, the first imaged pixel of the subsequently imaged swath can be spaced from the last imaged pixel of the previously imaged swath by a distance related to a pitch distance between imaged pixels.

Referring back to FIG. 3, red stripes 30, 32 and portion 34' of stripe 34 are imaged during a first scan of the imaging head. On completion of the first scan, imaging head 26 (in first position 38) is displaced along sub-scan axis 44 to a new position 38' (shown in broken line). Imaging head 26 is shown offset at new position 38' for the sake of clarity. In this example, the sub-scan displacement shown in FIG. 3 is related to the number of channels available on imaging head 26 (in this case, 35 channels). It is understood that imaging head 26 can comprise any suitable plurality of channels and is not limited to the 35 channels described in this example. The displaced multi-channel imaging head 26 at new position 38' locates the first channel 46 adjacent to the previous position of the last channel 45 of the imaging head 26 at first position 38 thus imaging a portion 34'' of stripe 34. It is very difficult to avoid the appearance of a visible discontinuity shown as line 47 at the boundary between portions 34' and 34'' of stripe 34. This visible discontinuity between adjacent imaged swaths can lead to one form of banding.

Banding may become more pronounced when a repeating pattern of non-contiguous features, such as a color filter, is produced. When imaging a repeating pattern of non-contiguous features, banding may be dominated by differing imaging characteristics associated with the outlying or "outboard" imaged non-contiguous features in comparison with the interior or "inboard non-contiguous features imaged within a give swath.

The donor elements 24 employed in thermal transfer processes typically have limited imaging latitude, and are thus considered to have non-linear imaging properties. Non-linear imaging properties can further exacerbate efforts to reduce artifacts such as banding.

Even very small power differences (on the order of 1%) in the output power of the imaging channels can affect an image characteristic (e.g. optical density or color density) of the transferred image forming material by varying the amount of imaged forming material that is transferred. Visual artifacts can be complicated when production demands require that a pattern of non-contiguous features be imaged by a plurality of imaging heads.

When an image is formed with a plurality of imaging heads 26, each of the imaging heads images a portion of the image. Each of the image portions must be formed in aligned relationship with the other image portions such that the plurality of image portions combine to form a unitary image with overall visually acceptable image characteristics. Precise alignment of the various image portions can is required to accurately stitch together image portions to provide a final image with suitable visual qualities.

In some applications such as color filters, the non-contiguous features formed in each of the image portions can be made to overlap corresponding portion of matrix 20 to lessen the registration burden between adjacent image portions. Although this may help to avoid a sharp visual discontinuity created by a minor misalignment between adjacent image portions, differences between the imaging channel characteristics between each head can still lead to visible discontinuities created by differences in the imaged characteristics of the non-contiguous features formed in each image portion. For example, the non-contiguous features formed in a first image portion can have a different density than the non-contiguous features formed in an adjacent image portion. This can lead to a visibly noticeable transition in density between the adjacent portions that can diminish the visual quality of the color filter.

Figure 4:
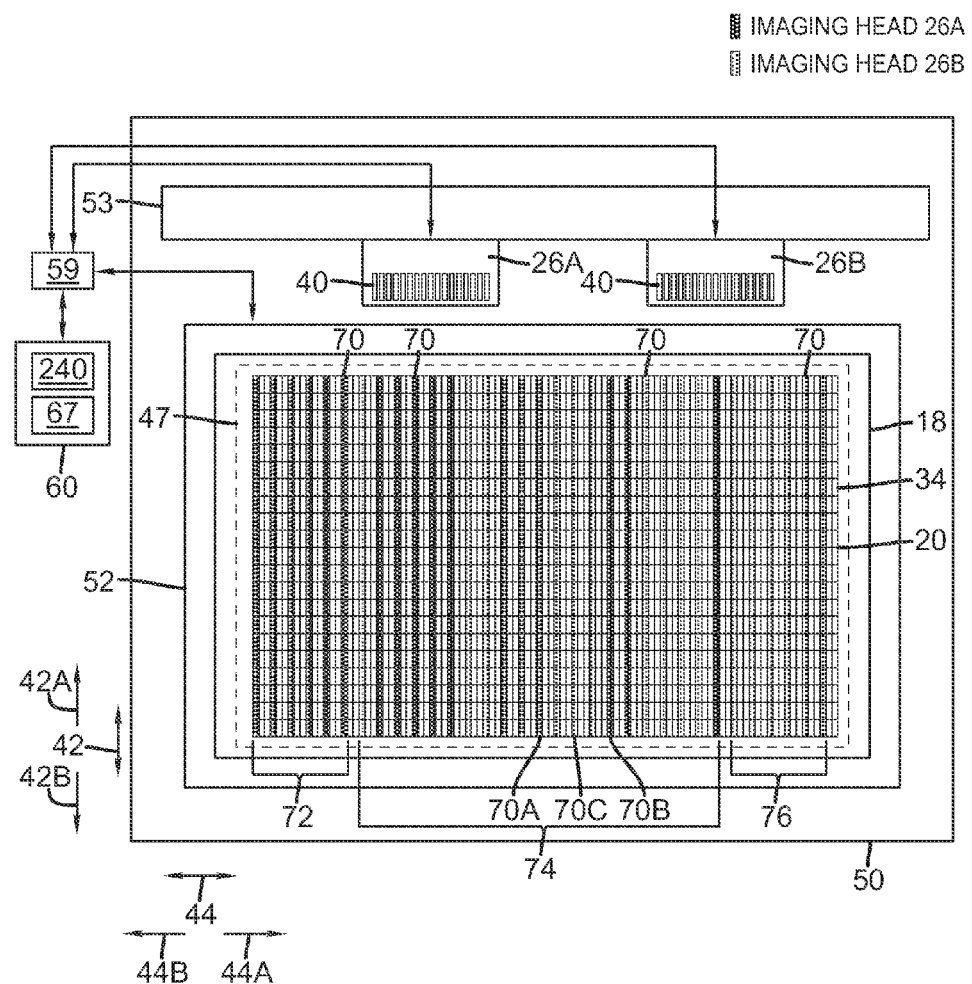
FIG. 4 is a schematic representation of an imaging of a pattern of features as per an example embodiment of the invention.

FIG. 4 shows schematically depicts an apparatus 50 used in an example embodiment of the invention. Apparatus 50 is operable for forming images on receiver element 18. Receiver element 18 includes a registration region 47 (shown in broken lines) in which an image is formed in alignment with. In this example embodiment of the invention, registration region 47 includes a matrix 20. Matrix 20 is an example of a pattern of registration sub-regions. Matrix 20 includes a plurality of cells 34. Cells 34 can be rectangular in shape as shown in FIG. 4 or any other suitable shape required by a given application. In this example embodiment of the invention a plurality of stripe features 70 are formed on receiver element 18 to produce a stripe configuration color filter.

In this example embodiment of the invention, images are formed on receiver element 18 by operating each of plurality of imaging heads 26A and 26B to direct imaging beams while scanning over receiver element 18. Each of imaging heads 26A and 26B can include a plurality of imaging channels 40. The plurality of imaging channels 40 can be arranged into a one dimensional or two dimensional array of imaging channels 40. Apparatus 50 includes a carrier 52 which is operable for conveying receiver element 18 along a path aligned with main-scan axis 42. Carrier 52 can move in a reciprocating fashion. In this example embodiment of the invention, carrier 52 is movable along a forward direction 42A and a reverse direction 42B. Imaging heads 26A and 26B are arranged on a support 53 that straddles carrier 52. Each of imaging heads 26A and 26B is controlled to move along paths aligned with sub-scan axis 44. In this example embodiment of the invention, each of the imaging heads 26A and 26B can be controlled to reciprocate along support 53. Each of the imaging heads 26A and 26B is moveable in a sub-scan direction. Each of the imaging heads 26A and 26B is movable along an away direction 44A and along a home direction 44B. It is to be understood that apparatus 50 includes two imaging heads for the purpose of example only and that other suitable plural numbers of imaging heads can be employed by various example embodiments of the invention.

In this example embodiment of the invention, images are formed by a laser-induced thermal transfer process. Imaging heads 26A and 26B are controlled to scan the media with a plurality of imaging beams to cause a transferal of an image forming material (not shown) from donor element 24 (not shown) to receiver element 18. Imaging electronics control activation timing of the imaging channels 40 to regulate the emission of the imaging beams. Motion system 59 (which can include one or more motion systems) includes any suitable prime movers, transmission members, and/or guide members to cause the motion of carrier 52. In this example embodiment of the invention, in addition to controlling the motion of carrier 52, motion system 59 controls the motion of each of imaging heads 26A and 26B. In this example embodiment of the invention, imaging head 26A is controlled to move independently of imaging head 26B. Those skilled in the art will readily realize that separate motion systems can also be used to operate different systems and components within apparatus 50.

Figure 5:
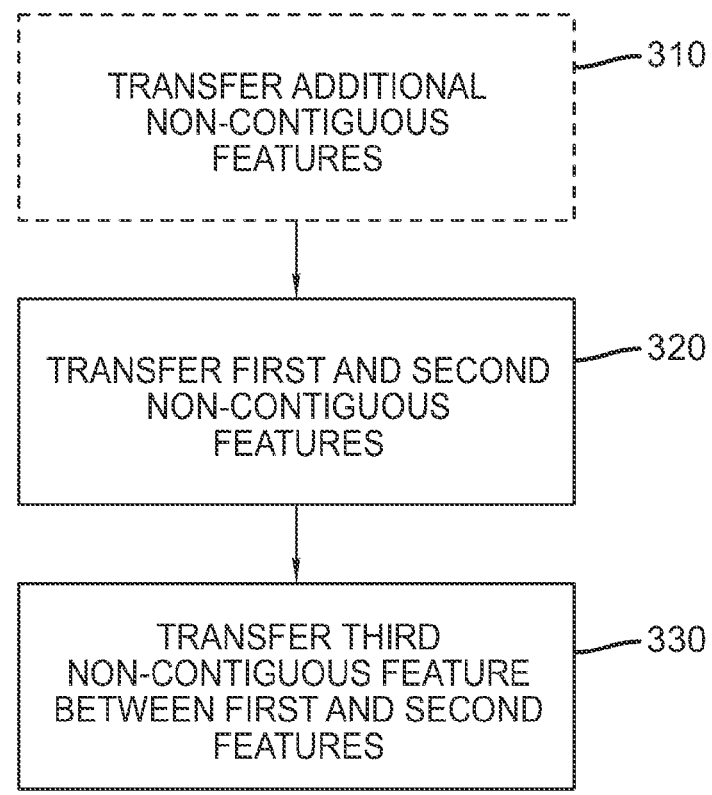
FIG. 5 is a flow chart for an imaging method of an example embodiment of the invention.

Controller 60, which can include one or more controllers is used to control one or more systems of apparatus 50 including, but not limited to, various motion systems 59 employed by carrier 52 and imaging heads 26A and 26B. Controller 60 can also control media handling mechanisms that can initiate the loading and/or unloading of receiver element 18 and donor element 24. Controller 60 can also provide image data 240 to imaging heads 26A and 26B and control each of the imaging heads to emit imaging beams in accordance with this data. Various systems can be controlled using various control signals and/or implementing various methods. Controller 60 can be configured to execute suitable software and can include one or more data processors, together with suitable hardware, including by way of non-limiting example: accessible memory, logic circuitry, drivers, amplifiers, A/D and D/A converters, input/output ports and the like. Controller 60 can comprise, without limitation, a microprocessor, a computer-on-a-chip, the CPU of a computer or any other suitable microcontroller. FIG. 5 shows a flow chart for imaging a pattern of non-contiguous features as per an example embodiment of the present invention. The flow chart shown in FIG. 5 refers to apparatus 50 and the corresponding imaged pattern of stripe features 70 as schematically shown in FIG. 4, although it is understood that other apparatus and other patterns of non-contiguous features are suitable for use with the illustrated process. In this example embodiment of the invention, each stripe feature 70 is transferred from donor element 24 to receiver element 18 by operating each of imaging heads 26A and 26B in a laser induced thermal transfer process. For the sake of clarity, stripe features 70 transferred by operating imaging head 26A are shaded differently from stripe features 70 transferred operating imaging head 26B. In this example embodiment of the invention, each stripe feature 70 is imaged by operating a contiguous plurality of imaging channels 40. Imaging channels 40 are operated to direct imaging beams which are scanned across receiver element 18 along a scan path. Non-contiguous features can be spatially separated from one another in a direction that is substantially transverse to a scan path.

During process step 320 imaging head 26A is operated to direct imaging beams transfer at least a first and a second non-contiguous feature to the receiver element. In this example, first stripe feature 70A and second stripe feature 70B are transferred from donor element 24 to receiver element 18 while scanning over receiver element 18 along a scan path. In step 330, imaging head 26B is operated to transfer a third non-contiguous feature. In this example, stripe feature 70C is transferred between stripe features 70A and 70B. In this example embodiments of the invention, stripe features 70A, 70B and 70C are spatially separated from one another in a direction of the sub-scan axis 44.

Stripe features 70A, 70B, and 70C are formed in an overlap region 74, in which strip features 70 formed by imaging head 26A are interleaved with stripe features 70 formed by imaging head 26B. Interleaving non-contiguous features formed by different imaging heads in an overlap region 74 improves the uniformity of the transferred pattern of non-contiguous features. Visual discontinuities created by differences in the imaged characteristics of the non-contiguous features formed by each imaging head are reduced by interleaving the non-contiguous features in an overlap region 74. In overlap region 74, the imaged characteristics (e.g. optical density or color density) of the formed non-contiguous features can be made to gradually change from one imaging head to the next thereby blending any imaging variations between the imaging heads.

In this example embodiment of the invention, the imaging beams (not shown) generated by imaging head 26A are scanned over receiver element 18 along a scan path as imaging head 26A is advanced relative to receiver element 18 along a scan direction. Stripe features 70A and 70B can be formed during one or more scans of imaging head 26A over receiver element 18. In some example embodiments of the invention, stripe features 70A and 70B are formed during the same scan. In some example embodiments of the invention, stripe features 70A and 70B are formed during different scans. Imaging head 26A can be advanced relative to receiver element 18 along parallel directions during each scan. Imaging head 26A can be advanced relative to receiver element 18 along a scan direction during a first scan and along a direction opposite to the scan direction during a second scan. In this example embodiment of the invention, imaging head 26B is advanced relative to receiver element 18 while transferring stripe feature 70C to receiver element 18. In this example embodiment of the invention, imaging head 26B is advanced relative to receiver element 18 along a direction that is parallel to a direction that imaging head 26A is advanced relative to receiver element 18 while transferring at least one of stripe features 70A and 70B to receiver element 18. In some example embodiments of the invention, imaging head 26B is advanced relative to receiver element 18 along a direction that is opposite to a direction that that imaging head 26A is advanced relative to receiver element 18 while transferring at least one of stripe features 70A and 70B to receiver element 18.

A size of overlap region 74 can be varied in accordance with the number of non-contiguous features that are to be formed in overlap region 74. The number and arrangement of non-contiguous features that are formed by each of the imaging heads 26A and 26B can be determined to best blend imaging variations across the imaging heads. In some example embodiments of the invention, two or more sets of non-contiguous features can be taken from a pattern of the non-contiguous features. Each of the sets can include one or more non-contiguous features. Each non-contiguous feature in a first set transferred by a first imaging head is interleaved with the non-contiguous features of an additional set transferred by a second imaging head. Each set can be transferred to receiver element 18 until the entire pattern of non-contiguous features corresponding to overlap region 74 is transferred.

Each of the sets of non-contiguous features can have different arrangements of non-contiguous features. Non-contiguous features can be assigned to at least one of the sets randomly, pseudo randomly, or in accordance with a predetermined arrangement. In the example embodiment of the invention shown in FIG. 4, imaging head 26A transfers a first set of the two or more sets while the imaging head 26B transfers an additional set of the two or more sets. The first set includes a plurality of groups of one or more non-contiguous features and each group is separated from each other group by varying numbers of stripe features 70 of the additional set. A minimum spacing between each group of the plurality of groups is greater than a minimum spacing between features in the pattern. Each group in the first set is separated from each other group in the first set by varying distances. In another example embodiment of the invention, the first set includes a first plurality of groups of one or more non-contiguous feature arranged along a first direction and the spacing between adjacent groups of the first plurality of groups increases in the first direction. The additional set includes a second plurality of groups of one or more non-contiguous features arranged along the first direction and the spacing between adjacent groups of the second plurality decreases in the first direction. In FIG. 4, the first direction is a sub-scan direction. In some example embodiments of the invention, the first direction is transverse to the scan path. Those skilled in the art will realize that different interleaving patterns are also within the scope of the present invention.

Figure 4A:
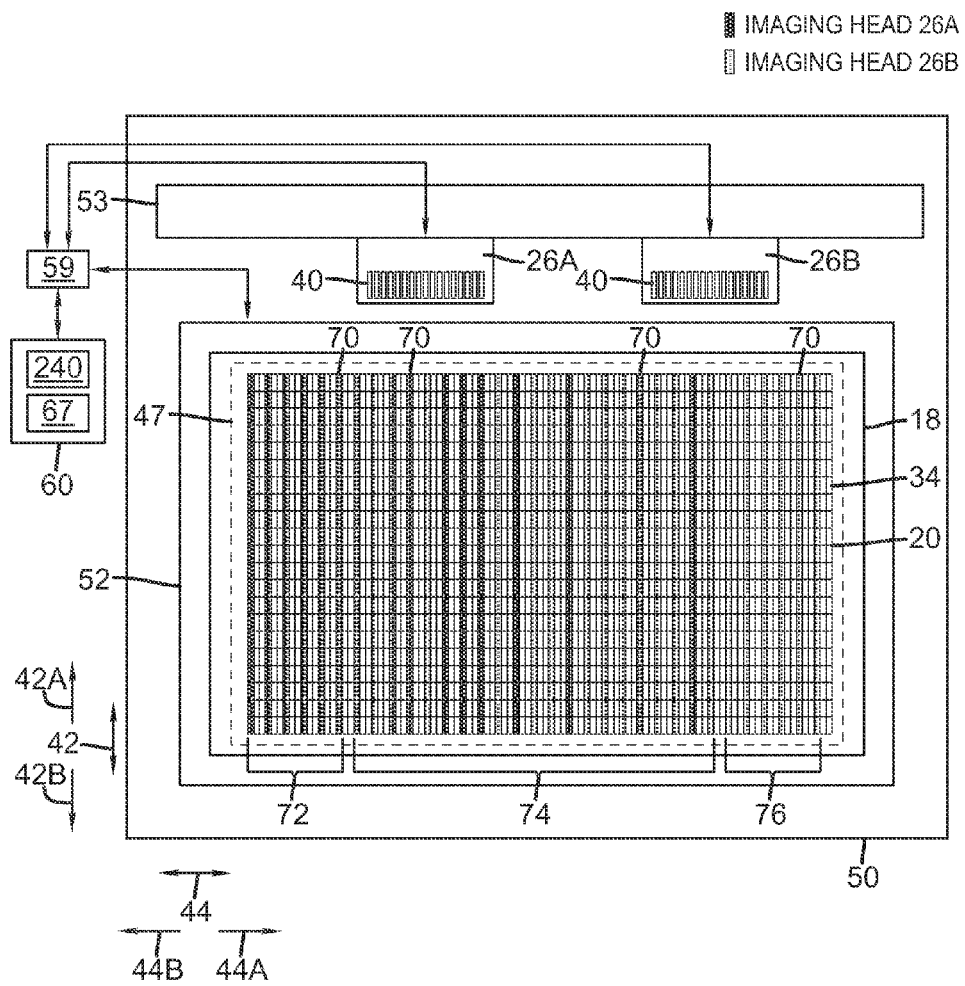
FIG. 4A is a schematic representation of an imaging of a pattern of features as per an example embodiment of the invention.

FIG. 4A shows an interleaving pattern as per an example embodiment of the invention in which stripe features 70 imaged by apparatus 50 are interleaved in overlap region 74. In this example embodiment of the invention, an arrangement of various stripe features 70 imaged by at least one of the plurality of imaging heads is determined randomly. Again for the sake of clarity, stripe features 70 imaged by a imaging head 26A are shaded differently than stripe features 70 imaged by imaging head 26B.

Referring back to FIG. 4 and FIG. 5, imaging head 26A is operated to transfer an additional plurality of stripe features 70 to region 72 of receiver element 18 and imaging head 26B is operated to transfer an additional plurality of stripe features 70 to region 76 of receiver element 18 in step 310. A region such as region 72 or region 76 is imaged by a single head. In this example embodiment of the invention, each of regions 72 and 76 are imaged by only by one of the imaging heads employed to image overlap region 74. Non-contiguous features transferred to region 72 by imaging head 26A are not interleaved with non-contiguous features imaged by imaging head 26B. By stitching the images formed by each of the imaging heads 26A and 26B in select regions (e.g. overlap region 74), reductions in imaging throughput can be managed. Step 310 (shown in broken lines) is optional and it is understood that regions 72 and 76 can be imaged at any time and not necessarily before overlap region 74 is imaged. For example, imaging head 26A can undergo an imaging process where it first transfers various stripe features 70 to region 72 and then transfers stripe features 70A and 70B to overlap region 74. Imaging head 26B can undergo a different process where it first transfers stripe feature 70C to overlap region 74 and then transfers various stripe features 70 to region 76.

Imaging heads 26A and 26B can be operated to transfer stripe features 70 to regions 72 and 76 respectively over a number of scans. For example, region 72 may be sufficiently large that it must be imaged by a plurality of image swaths, each image swath being formed during a scan. Image characteristics such as optical density or color density can vary among a plurality of non-contiguous features imaged in an image swath by a single imaging head. These variations can lead to a banding artifact among the image swaths formed by the image head. In some example embodiments of the invention, a plurality of non-contiguous features is transferred to a receiver element by operating a single imaging head to transfer the non-contiguous features in an interleaved fashion during a plurality of scans. The plurality of non-contiguous features can be part of a first pattern of non-contiguous features. Two or more sets of the non-contiguous features can be taken from the first pattern. Each of the two or more sets includes one or more non-contiguous features and a first set of the two or more sets is interleaved with the non-contiguous features in an additional set of the two or more sets. Interleaving a pattern of non-contiguous features in which each feature is formed by a single imaging head can be used to correct for variations in the image characteristics of those features.

Figure 6:
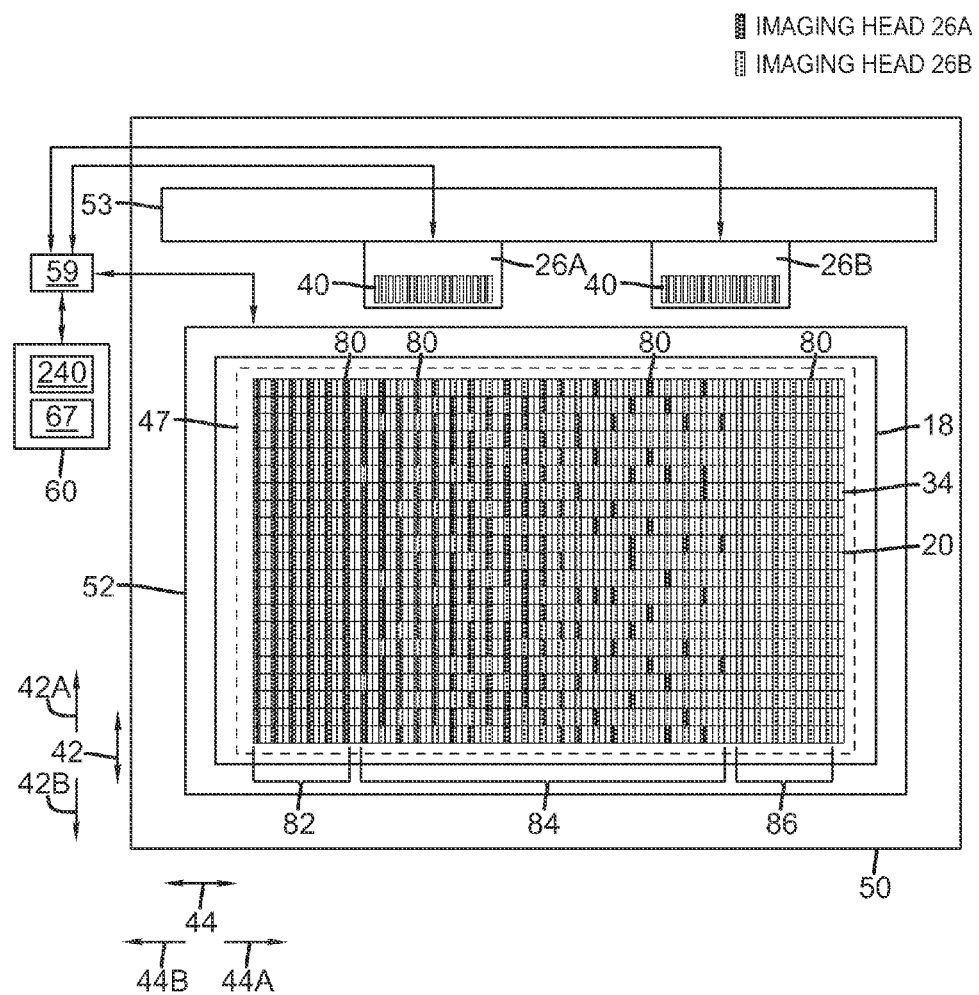
FIG. 6 is schematic representation of an imaging of a pattern of features as per an example embodiment of the invention.

FIG. 6 shows a pattern of color features 80 imaged by imaging heads 26A and 26B of apparatus 50 as per an example embodiment of the invention. Again for the sake of clarity, color features 80 formed by imaging head 26A are shaded differently from color features 80 formed by imaging head 26B. In this example embodiment of the invention, each color feature 80 is transferred to a cell 34 of matrix 20 formed on receiver element 18. In this example embodiment of the invention, color features 80 are part of a "stripe configuration" color filter. Color features 80 are examples of non-contiguous features that are separated from one another in a sub-scan direction.

Color features 80 are formed in an overlap region 84 by both imaging heads 26A and 26B. In this example embodiment of the invention, color features 80 are formed in a two dimensional interleaved pattern in which the color features formed by imaging head 26A in overlap region 84 are interleaved in a direction along a scan path as well as in a sub-scan direction with color features 80 formed by imaging head 26B in overlap region 84. In some example embodiments of the invention, two or more sets of color features 80 can be taken from a pattern of color features. Each of the sets can include one or more color features 80. Various color features 80 in a first set transferred by imaging head 26A are interleaved in a two dimensional fashion with the color features 80 of an additional set transferred by imaging head 26B. Each of the sets of the two or more sets can be transferred to receiver element 18 until the entire pattern of color features 80 corresponding to overlap region 84 is transferred.

Each of the sets can have different arrangements of color features 80 Color features 80 can be assigned to each of the sets randomly, pseudo randomly, or in accordance with a predetermined arrangement. In this example embodiment of the invention, interrupted stripes are formed by each of the imaging heads 26A and 26B in overlap region 84. Imaged portions of the interrupted stripes include groups of one or more color features 80. In some cases, two dimensional interleaved patterns are especially well suited to blending imaging variations between the imaging heads as the imaged characteristics (e.g. optical density or color density) of imaged non-contiguous features are mixed both along and transverse to a scan direction.

Figure 7:
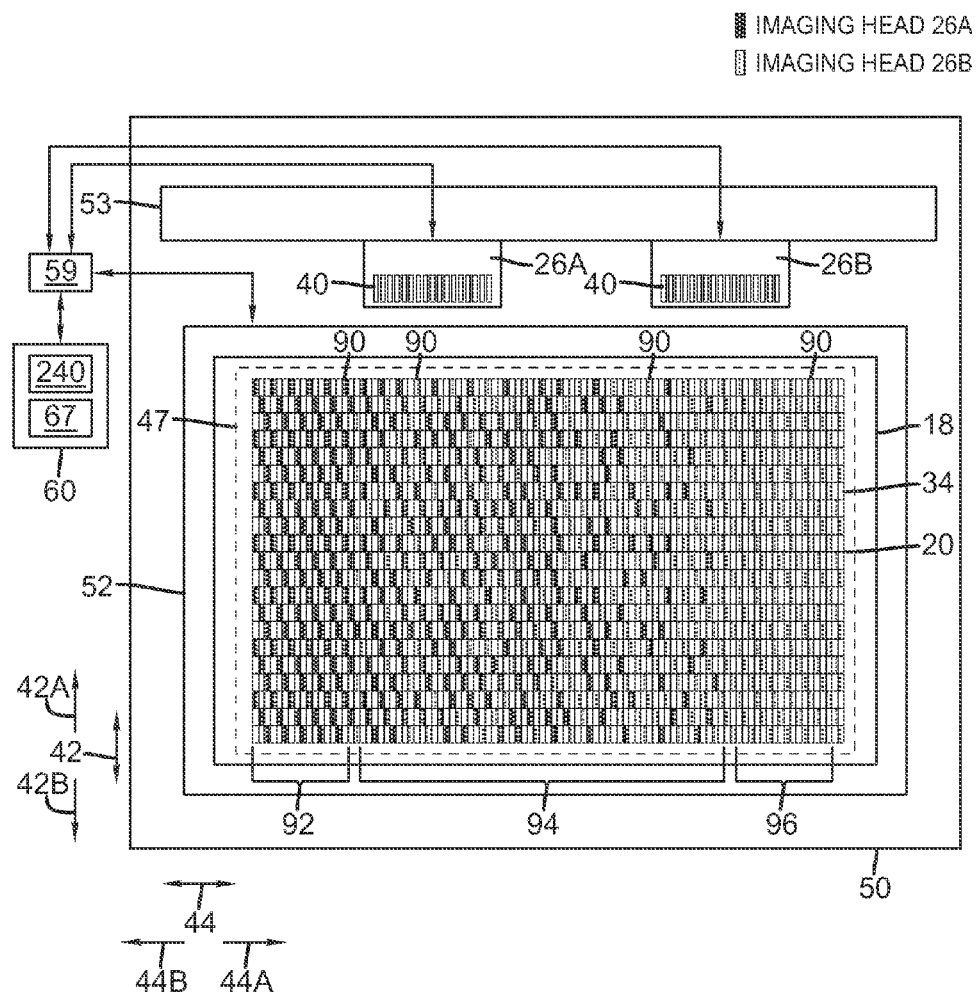
FIG. 7 is a schematic representation of an imaging of a pattern of features as per an example embodiment of the invention.

FIG. 7 shows a pattern of color features 90 imaged by imaging heads 26A and 26B of apparatus 50 as per an example embodiment of the invention. Again for the sake of clarity, color features 90 formed by imaging head 26A are shaded differently from color features 90 formed by imaging head 26B. In this example embodiment of the invention, each color feature 90 is transferred to a cell 34 of matrix 20 formed on receiver element 18. In this example embodiment of the invention, color features 90 are part of a "mosaic configuration" color filter. Color features 90 are also known as island features.

Apparatus 50 can form patterns of non-contiguous features in substantial alignment with the pattern of registration sub-regions. In this example embodiment of the invention, apparatus 50 forms various color filter patterns. The visual quality of each of the color filter feature patterns alone or combined is dependant at least in part on the final alignment between the formed non-contiguous features and the pattern of registration sub-regions. In this example embodiment of the invention, the visual quality is dependant upon the registration of the imaged color features with a matrix 20. In this example embodiment of the invention, matrix 20 is overlapped to help lessen the registration tolerances with which the color features must be registered with matrix 20. However, there are typically limits to the extent that a matrix 20 can be overlapped. For example, the visual quality of an image produced in a laser-induced thermal transfer process is typically sensitive to the amount of image forming material that is transferred from donor element 24 to receiver element 18. The amount of transferred image forming material is typically sensitive to a spacing between the donor element 24 and receiver element 18. If adjacent features of different colors overlap themselves over portions of matrix 20, the donor-to-receiver element spacing will additionally vary during the subsequent imaging of additional donor elements. In this regard, it is typically preferred that adjacent features of different colors not overlap themselves over a matrix portion. This requirement places additional constraints on the required alignment between a pattern of color features and a pattern of matrix cells and requires that adjacent features be separated from one another by some distance. In the case of patterns of island features (e.g. a mosaic pattern) a plurality of island features of a first color can include some island features that are separated from some other island feature by of the first color by an island feature of a different color in one or more directions. Each of the island features can be outlined by matrix 20. Each of the island features can overlap portions of matrix 20. Each of the island features can overlap portions of matrix 20 without overlapping themselves.

Figure 7A:
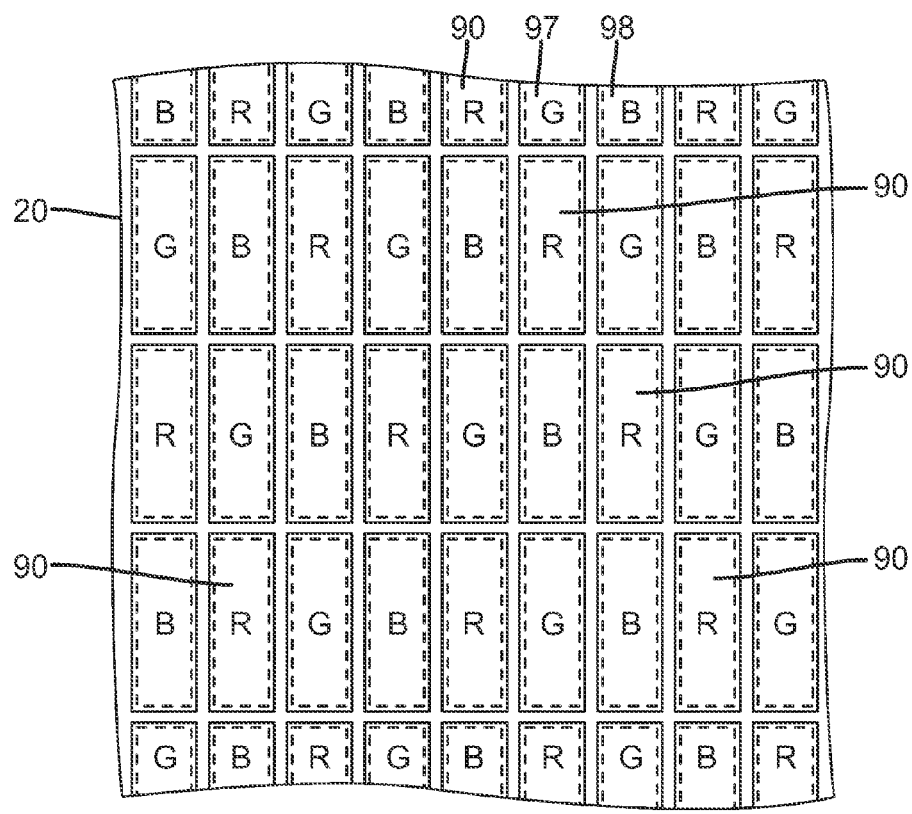
FIG. 7A is a detailed view of a portion of the pattern of color features shown in FIG. 7 including additional features of different colors.

Referring back to FIG. 7, each of the color features 90 are spatially separated from one another along a scan path. Color features 90 in each row of the pattern are spatially separated from one another in a sub-scan direction. FIG. 7A shows a detailed view of a portion of the pattern of color features 90 shown in FIG. 7. FIG. 7A shows that color features 90 are island features that each partially overlap matrix 20 across both the rows and columns of the filter without overlapping other color features. In this example, color features 90 are represented as red color features. Additional features not shown in FIG. 7 (i.e. green color features 97 and blue color features 98) have been added to FIG. 7A to show an example arrangement of patterns of different colors. Color features 90 are examples of non-contiguous features.

Color features 90 are formed in an overlap region 94 by both imaging heads 26A and 26B. In this example embodiment of the invention, color features 90 are formed in a two dimensional interleaved pattern in which the color features formed by imaging head 26A on overlap region 94 are interleaved in a direction along a scan path as well as in a sub-scan direction with color features 90 formed by imaging head 26B on overlap region 94. In this example embodiment of the invention, interrupted stripes are formed by each of the imaging heads 26A and 26B in overlap region 94.

A program product 67 can be used by controller 60 to perform various functions required by apparatus 50. Without limitation, program product 67 may comprise any medium which carries a set of computer-readable signals comprising instructions which, when executed by a computer processor, cause the computer processor to execute a method as described herein. The program product 67 may be in any of a wide variety of forms. The program product 67 may comprise, for example, physical media such as magnetic storage media including floppy diskettes, hard disk drives, optical data storage media including CD ROMs, DVDs, electronic data storage media including ROMs, flash RAM, or the like. The instructions may optionally be compressed and/or encrypted on the medium.

For the methods described, pluralities of non-contiguous features can be arranged in various patterns. The non-contiguous features can be arranged in repeating patterns of non-contiguous features. Repeating patterns of non-contiguous features can also include repeating patterns of island features. The invention is not limited to imaging rectangular shaped island features, however. Patterns of non-contiguous features can include regular patterns.

A non-contiguous feature can be imaged in a continuous tone or contone process such as dye sublimation. In a continuous tone or contone image, the perceived optical density is function of the quantity of colorant per pixel, higher densities being obtained by transferring greater amounts of colorant.

A non-contiguous feature can be imaged in accordance with image data that includes halftone screening data. In halftone imaging, the non-contiguous features comprise halftone dots. The halftone dots vary in size according to the desired lightness or darkness of the imaged feature. As previously stated, each channel in a multi-channel imaging head 26 is operable for imaging a pixel on an imageable media. A single halftone dot is typically is typically made up of a matrix of pixels imaged by a plurality of imaging channels. Halftone dots are typically imaged at a chosen screen ruling typically defined by the number of halftone dots per unit length and a chosen screen angle typically defined by an angle at which the halftone dots are oriented. In example embodiments of the invention, a non-contiguous feature can be imaged with a screen density in accordance with the corresponding halftone screen data chosen to image that feature.

In other example embodiments of the invention, a feature may be imaged with stochastic screen made up of a varying spatial frequency of equally sized dots. In yet other example embodiments of the invention, a feature may be imaged with a combined halftone and stochastic screen (commonly referred to as a "hybrid" screen).

It is to be understood that any suitable multi-channel imaging head that has individually addressable channels, each capable of producing a modulated imaging beam, may be used. Without limitation, multi-channel imaging heads 26 used in accordance with example embodiments of the invention can include individually addressable channels 40 that comprise a light valve arrangement similar to the system shown in FIG. 2. Alternatively, any suitable light valve system that can create the required addressable channels 40 within imaging head 26 can be used. Such systems include, without limitation, cantilever or hinged mirror type light valves such as the Digital Micromirror Device (DMD) developed by Texas Instruments of Dallas, Tex.; and grating light valves such as the "Grating Light Valve" developed by Silicon Light Machines of Sunnyvale, Calif. In the alternative, the multi-channel imaging head can include imaging channels that comprise individually-controllable light sources (such as laser sources that emit visible light, infrared light, or other light). Laser arrays other than laser diode arrays can also be employed as sources. For example, the arrays can be formed using a plurality of fibers coupled laser diodes with fiber tips held in spaced apart relation to each other, thus forming an array of laser beams. The output of such fibers may be likewise be coupled into a light pipe and scrambled to produce a homogenous illumination line. In another alternative embodiment, the fibers comprise a plurality of fiber lasers with outputs arrayed in fixed relation.

Some embodiments of the invention employ infrared lasers. Some infrared diode laser arrays employ 150 µm emitters with total power output of around 50 W at a wavelength of 830 nm. It will be apparent to practitioners in the art that alternative lasers including visible light lasers may also be used in practicing the invention and that the choice of laser source employed may or may not be dictated by the properties of the media to be imaged.

Patterns of non-contiguous features have been described in terms of patterns of color features in a display. In some example embodiments of the invention, the non-contiguous features can be part of an LCD display. In other example embodiments of the inventions, the non-contiguous features can be part of an organic light-emitting diode (OLED) display. OLED displays can include different configurations. For example, in a fashion similar to an LCD display, different color features can be formed into a color filter used in conjunction with a white OLED source. Alternatively, different color illumination sources in the display can be formed with different OLED materials with various embodiments of the invention. In these embodiments, the OLED based illumination sources themselves control the emission of colored light without necessarily requiring a passive color filter. OLED materials can be transferred to suitable media. OLED materials can be transferred to a receiver element with laser-induced thermal transfer techniques.

While the invention has been described using as examples applications in display and electronic device fabrication, the methods described herein are directly applicable to imaging any patterns of features including those used in biomedical imaging for lab-on-a-chip (LOC) fabrication. LOC technology is a rapidly growing research topic within the Instrumentation and Healthcare industries. The principle is to produce an automated, micro-scale laboratory to enable sample preparation, fluid handling, analysis and detection steps to be carried out within the confines of a single micro-chip. LOC chips have several repeating patterns of non-contiguous features.

It is to be understood that the exemplary embodiments are merely illustrative of the present invention and that many variations of the above-described embodiments can be devised by one skilled in the art without departing from the scope of the invention. It is therefore intended that all such variations be included within the scope of the following claims and their equivalents.

What is claimed is:

1. A method for forming a plurality of non-contiguous features on a receiver element, the method comprising:
    operating a first multi-channel imaging head to direct imaging beams along a scan path to transfer a first non-contiguous feature and a second non-contiguous feature from a donor element to the receiver element by a thermal transfer process wherein the first and second non-contiguous features are spatially separated from one another at least in a sub-scan direction;
    operating a second multi-channel imaging head to direct imaging beams to transfer a third non-contiguous feature from the donor element to the receiver element by the thermal transfer process, wherein the third non-contiguous feature is between the first and second non-contiguous features and is spatially separated from each of the first and second non-contiguous features at least in the sub-scan direction; and
    wherein each of the non-contiguous features is screened with at least one of a halftone screen and stochastic screen.

* * * * *